(12) United States Patent
Harrison

(10) Patent No.: US 7,042,265 B2
(45) Date of Patent: *May 9, 2006

(54) INTERLACED DELAY-LOCKED LOOPS FOR CONTROLLING MEMORY-CIRCUIT TIMING

(75) Inventor: Ronnie M. Harrison, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/914,757

(22) Filed: Aug. 9, 2004

(65) Prior Publication Data

US 2005/0007157 A1  Jan. 13, 2005

Related U.S. Application Data

(63) Continuation of application No. 09/259,625, filed on Feb. 26, 1999, now Pat. No. 6,777,995.

(51) Int. Cl.
*H03H 11/26* (2006.01)

(52) U.S. Cl. ................... 327/271; 327/261

(58) Field of Classification Search ........ 327/148–150, 327/152–153, 157–159, 161, 244–247, 250–251, 327/269–272, 261, 274, 291, 276, 277; 375/215, 375/375, 376; 331/11–12
See application file for complete search history.

(56) References Cited

U.S. PATENT DOCUMENTS

| | | | |
|---|---|---|---|
| 3,634,772 A | 1/1972 | Katz | 328/138 |
| 4,890,248 A | 12/1989 | Reinhardt | 364/574 |
| 5,054,038 A | 10/1991 | Hedberg | 375/118 |
| 5,216,302 A | 6/1993 | Tanizawa | 307/603 |
| 5,298,866 A | 3/1994 | Kaplinsky | 328/155 |
| 5,440,514 A | 8/1995 | Flannagan et al. | 365/194 |
| 5,594,376 A * | 1/1997 | McBride et al. | 327/236 |
| 5,631,591 A | 5/1997 | Bar-Niv | 327/158 |
| 5,673,005 A | 9/1997 | Pricer | 331/1 R |
| 5,684,421 A | 11/1997 | Chapman et al. | 327/261 |
| 5,841,325 A | 11/1998 | Knotts et al. | 331/57 |
| 5,917,352 A | 6/1999 | Dunlap et al. | 327/158 |
| 5,933,031 A | 8/1999 | Konno | 327/7 |
| 6,011,822 A | 1/2000 | Dreyer | 375/376 |
| 6,031,402 A | 2/2000 | Wang et al. | 327/157 |

(Continued)

OTHER PUBLICATIONS

"4M×18 SLDRAM 400 Mb/s/pin SLDRAM", *The SLDRAM Consortium*. Draft/Advance,(1997),pp. 1-10.

(Continued)

*Primary Examiner*—Linh My Nguyen
(74) *Attorney, Agent, or Firm*—Schwegman, Lundberg, Woessner & Kluth, P.A.

(57) ABSTRACT

For control, some memory circuits use a delay-locked loop to generate a set of signals, each delayed a different amount relative a reference signal. However, as circuits get faster and faster, conventional delay-locked loops require use of extra interpolation circuitry to generate smaller delays, and thus consume considerable power and circuit space. Accordingly, the inventor devised a circuit which interlaces and synchronizes two delay-locked loops, each including a number of controllable delay elements linked in a chain. In one embodiment, the first loop produces a sequence of clock signals delayed an even number of delay periods relative a reference clock signal, and the second loop produces a sequence of clock signals delayed an odd number of delay periods relative the reference clock signal. In addition, the first and second loops are synchronized.

39 Claims, 11 Drawing Sheets

U.S. PATENT DOCUMENTS

| | | | |
|---|---|---|---|
| 6,055,287 A | 4/2000 | McEwan | 375/376 |
| 6,130,552 A * | 10/2000 | Jefferson et al. | 326/39 |
| 6,338,127 B1 | 1/2002 | Manning | 711/167 |
| 6,777,995 B1 * | 8/2004 | Harrison | 327/271 |

OTHER PUBLICATIONS

Christiansen, J., "An Integrated High Resolution CMOS Timing Generator Based on an Array of Delay Locked Loops", *IEEE Journal of Solid-State Circuits,* 31 (7), (Jul. 1996),pp. 952-957.

Gillingham, P., "SLDRAM Architectural and Functional Overview", *The SLDRAM Consortium,* (Aug. 1997),pp. 1-14.

Knotts, T. A., et al., "WP 3.6: A 500MHz Time Digitizer IC with 15.625ps Resolution", *Proceedings of the IEEE International Solid-State Circuits Conference, Digest of Technical Papers,* ISSCC94/Session 3/Analog Techniques/Paper WP 3.6,(Feb. 16, 1994),pp. 58-59.

Maneatis, John G., "Low-Jitter Process-Independent DLL and PLL Based on Self-Biased Techniques", *IEEE Journal of Solid-State Circuits,* 31(11), (Nov. 1996), 1723-1732.

Rahkonen, T. E., et al., "The Use of Stabilized CMOS Delay Lines for the Digitization of Short Time Intervals", *IEEE Journal of Solid-State Circuits,* 28 (8), (Aug. 1993),pp. 887-894.

* cited by examiner

INTERLACED DELAY-LOCKED LOOPS FOR CONTROLLING MEMORY-CIRCUIT TIMING

This application is a Continuation of U.S. application Ser. No. 09/259,625, filed Feb. 26, 1999, now U.S. Pat. No. 6,777,995, which is incorporated herein by reference.

TECHNICAL FIELD

The present invention concerns memory circuits and clock-generation circuits which include delay-locked loops for controlling memory circuits.

BACKGROUND OF THE INVENTION

Memory circuits are vital components in computers and other electronic systems which require data storage. A typical memory circuit is an interconnected network of millions of microscopic memory cells, each of which stores an electric charge representing a one or zero data bit. The memory cells are usually arranged into rows and columns, with each cell having a unique address based on its row and column position.

Memory operations, usually initiated by a computer processor, include writing and reading the memory cells. In writing, sometimes called recording or programming, the processor sends command signals specifying a write operation, address signals identifying one or more memory cells, and data signals representing the data to be stored, or written to, the one or more memory cells. The memory circuit has circuitry not only for latching, that is, temporarily storing current signal states, but also for interpreting, or decoding, the command signals. Once the latched command signals are decoded, the memory circuit addresses, or accesses, the memory cells corresponding to the latched address signals and writes the latched data signals to them.

To read data, the processor sends command signals which specify a read operation and address signals which identify the memory cells to be read to the memory circuit. After latching the command and address signals, the memory circuit accesses the identified memory cells, converts their contents to data signals, latches the data signals, and finally outputs the latched data signals to the computer processor.

In both reading and writing, the latching, decoding, addressing, and outputting are all sequenced using clock signals—typically signals with a series of periodic or regularly spaced pulses—which coordinate the flow of signals into, through, and out of the memory circuit. Coordination often requires triggering one operation a certain time after another operation.

For example, during write operations, data signals are usually transferred, one word (a group of data bits) at a time, from a computer processor to a memory circuit using a clock signal to control when each word is sent. The sending of each word corresponds to a clock signal transition from high to low (or low to high), and the data signals travel over a set of wires, known as a data bus, connecting the processor to the memory circuit. As the data signals for one word arrive at input terminals of the memory circuit, the voltages of the input terminals change from their current voltage levels (which generally represent the previous word) to those for the current word. After this change, a latch circuit, triggered with the high-to-low (or low-to-high) transition of another clock, latches the data signals for the current word. To allow time for the change, the other clock signal is usually a delayed version of the data clock, with its transitions occurring a set time, or delay period, after those of the data clock.

Since writing entails a number of sequential operations that are delayed relative the data clock, memory circuits typically use several different delayed versions of the data clock. For instance, a memory circuit might include a set of clock signals delayed one, two, three, and four delay periods relative the data clock, with each of the delayed clock signals controlling a different part of the memory circuit.

One way of generating a set of delayed clock signals based on multiples of a delay period is to use a circuit known as a delay-locked loop, or DLL. The delay-locked loop is a chain of controllable delay elements, with the first delay element receiving an input clock signal and outputting a clock signal delayed one delay period, the second receiving this delayed clock signal and outputting a signal delayed two delay periods relative the input clock signal, and so forth. To ensure that each delayed clock signal is synchronized, or phase-locked, with the transitions of the input clock signal, a phase comparator compares one of the delayed clock signals to the input clock signal, and outputs a control signal, based on how far it is out of synch, to all the delay elements, decreasing or increasing their delays as necessary to keep all the delayed clock signals in step, or in phase, with the input clock.

As memory circuits have become faster, it has become increasingly difficult to design delay-locked loops which produce signals with smaller and smaller delays relative to a clock signal, such as the data clock. This is because conventional delay elements can only reliably provide a minimum delay of about 100 picoseconds (one-tenth of one billionth of a second.) To provide smaller delays, engineers have added "tiers" of interpolation circuitry to the basic delay-locked loop.

A first tier of the interpolation circuitry theoretically interpolates, or splits, the 100-picosecond difference between two signals of the delay-locked loop to produce a third signal delayed 50 picoseconds relative the two signals. A second tier of interpolation circuitry then splits the 50 picosecond difference between the third signal and one of the two original signals to produce a fourth signal delayed 25 picoseconds relative the one original signal. Using this interpolation approach in a non-memory application, one researcher reports achieving delays as small as 16 picoseconds. (See, T. A. Knotts and D. S. Chu, "A 500 MHZ Time Digitizer IC with 15.625 ps Resolution," 1994 IEEE International Solid State Circuits Conference, Digest of Technical Papers, First Edition, pp. 58–59.)

Unfortunately, this interpolation approach not only adds a significant amount of circuitry to the basic delay-locked loop, but also increases power consumption considerably. Thus, there is a need for a better way of achieving shorter delay periods between clock signals.

SUMMARY OF THE INVENTION

To address these and other needs, the inventor devised new clock-generation circuits and new methods of generating clock signals. One embodiment of a new clock-generation circuit interlaces and synchronizes two delay-locked loops. Each delay-locked loop includes a number of controllable delay elements linked in a chain. The first loop produces a sequence of clock signals delayed an even number of delay periods relative a reference clock signal, and the second loop produces a sequence of clock signals delayed an odd number of delay periods relative the reference clock signal. In addition, at least one delay element in the second loop is controlled based on a phase relationship between clock signals from each loop.

One embodiment of a method of generating clock signals entails generating a sets of even and odd clock signals, with each even clock signal delayed relative a reference clock signal by an even multiple of a desired delay period and each odd clock signal delayed relative the reference clock signal by an odd multiple of the desired delay period. The method also entails synchronizing at least one of the odd clock signals using one of the even clock signals.

Other aspects of the invention include a memory controller that incorporates one of the new clock-generation circuits and a computer system that incorporates the memory controller. One embodiment of the computer system includes a processor, and one or more synchronous dynamic random access memories (SDRAMs).

DESCRIPTION OF THE PREFERRED EMBODIMENTS

The following detailed description, which references and incorporates FIGS. 1–11, describes and illustrates specific embodiments of the invention. These embodiments, offered not to limit but only to exemplify and teach the concepts of the invention, are shown and described in sufficient detail to enable those skilled in the art to implement or practice the invention. Thus, where appropriate to avoid obscuring the invention, the description may omit certain information known to those of skill in the art.

Figure 1:
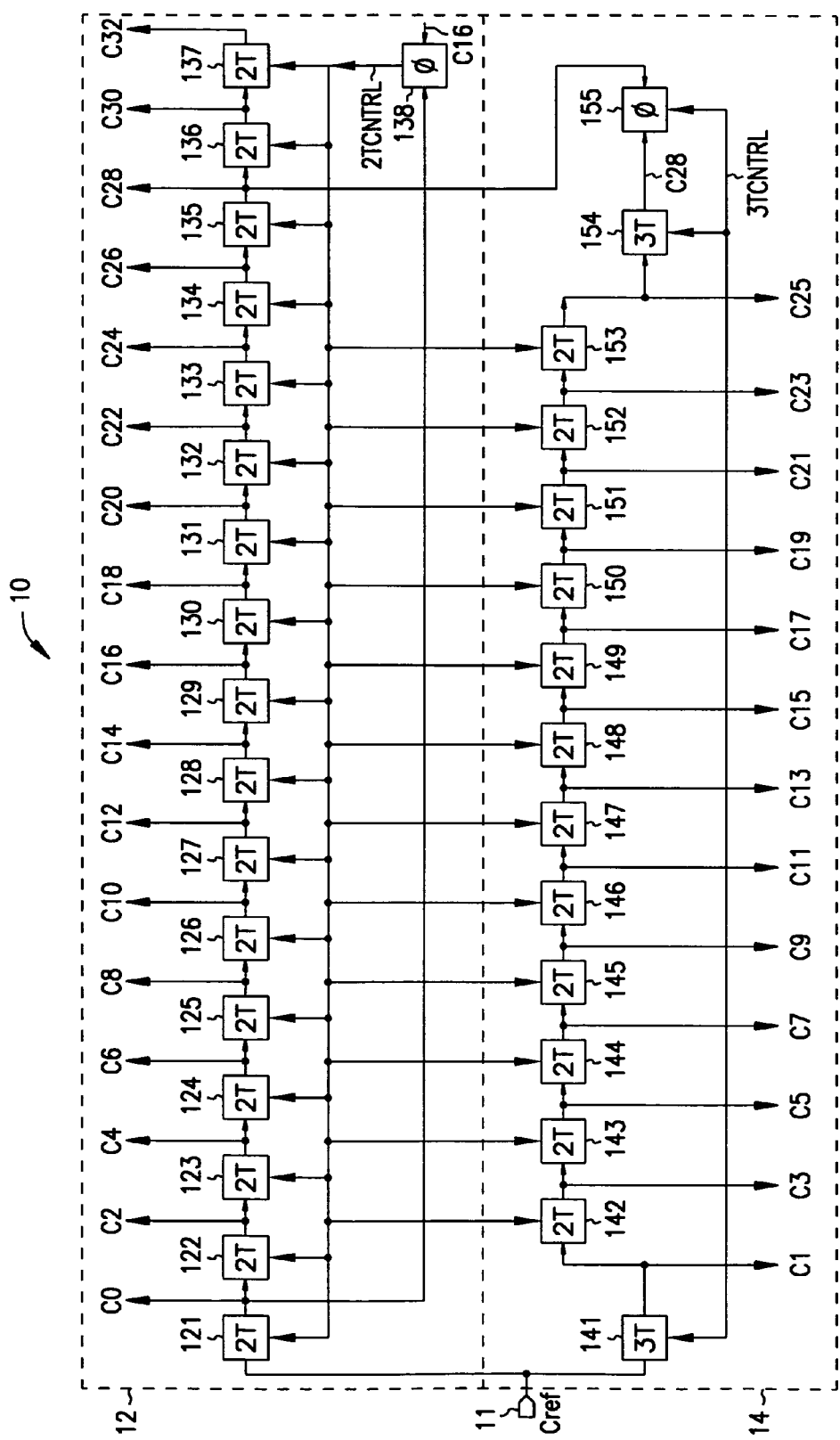
FIG. 1 is a block diagram of an exemplary clock generation circuit 10 including two interlaced delay-lock loops 12 and 14 in accord with the present invention.

FIG. 1 shows a block diagram of an exemplary clock-generation circuit 10 embodying concepts of the present invention. Circuit 10 includes an input terminal or node 11 for receiving an input (reference) clock signal Cref, and two interlaced delay locked loops 12 and 14 for providing a set of clock signals delayed a multiple number of delay periods T relative reference clock signal Cref. T represents a desired time delay which generally requires use of interpolation circuitry in combination with a delay-locked loop. In the exemplary embodiment, clock signal Cref is about 400 megahertz and T is about 78 picoseconds; however, other embodiments use different frequencies and delay periods. Delay-locked loop 12 includes a chain, or cascade network, of 17 controllable delay elements 121–137, and a differential phase amplifier 138. Similarly, delay-locked loop 14 includes a chain of 15 controllable delay elements 141–154 and a differential phase amplifier 155.

In loop 12, each controllable delay element provides a nominal delay 2T and includes respective input, output, and control nodes. The respective outputs of delay elements 121–137 provide a sequence of even phase-locked clock signals C0, C2, . . . C32, with each clock signal delayed an even number of delay periods T relative reference clock Cref. For example, clock signal C0 is delayed two delay periods T relative input clock signal Cref, and clock signal C2 is delayed four delay periods relative clock signal Cref. Note that C2 is delayed two delay period relative clock signal C0; C4 is delayed four delay periods T relative clock signal C0; and so forth.

In loop 14, delay elements 141 and 154 provide a nominal delay of 3T and delay elements 142–153 each provide a nominal delay 2T. Delay elements 141–154 include respective input, output, and control nodes. The respective outputs of delay elements 141–153 provide a sequence of odd phase-locked clock signals C1, C3, . . . C25, with each clock signal delayed an odd number of delay periods T relative reference clock Cref and clock signal C0. Thus, for example, clock signal C1 is delayed one delay period T relative clock signals C0; clock signal C3 is delayed three delay periods T relative clock signal C0; and so forth.

In operation, differential phase amplifier 138 compares the phases of clock signal C0 with one of the even clock signals, for example, clock signal C32 or C16, and outputs a delay-element control signal 2TCNTRL, which takes the form of a voltage or current signal, to each delay element in loop 12 and to delay elements 142–153 in loop 14. Control signal 2TCNTRL adjusts the delay of each element, maintaining each even clock signal and some of the odd clock signals, specifically C3–C25, in phase with reference clock signal Cref.

Figure 2:
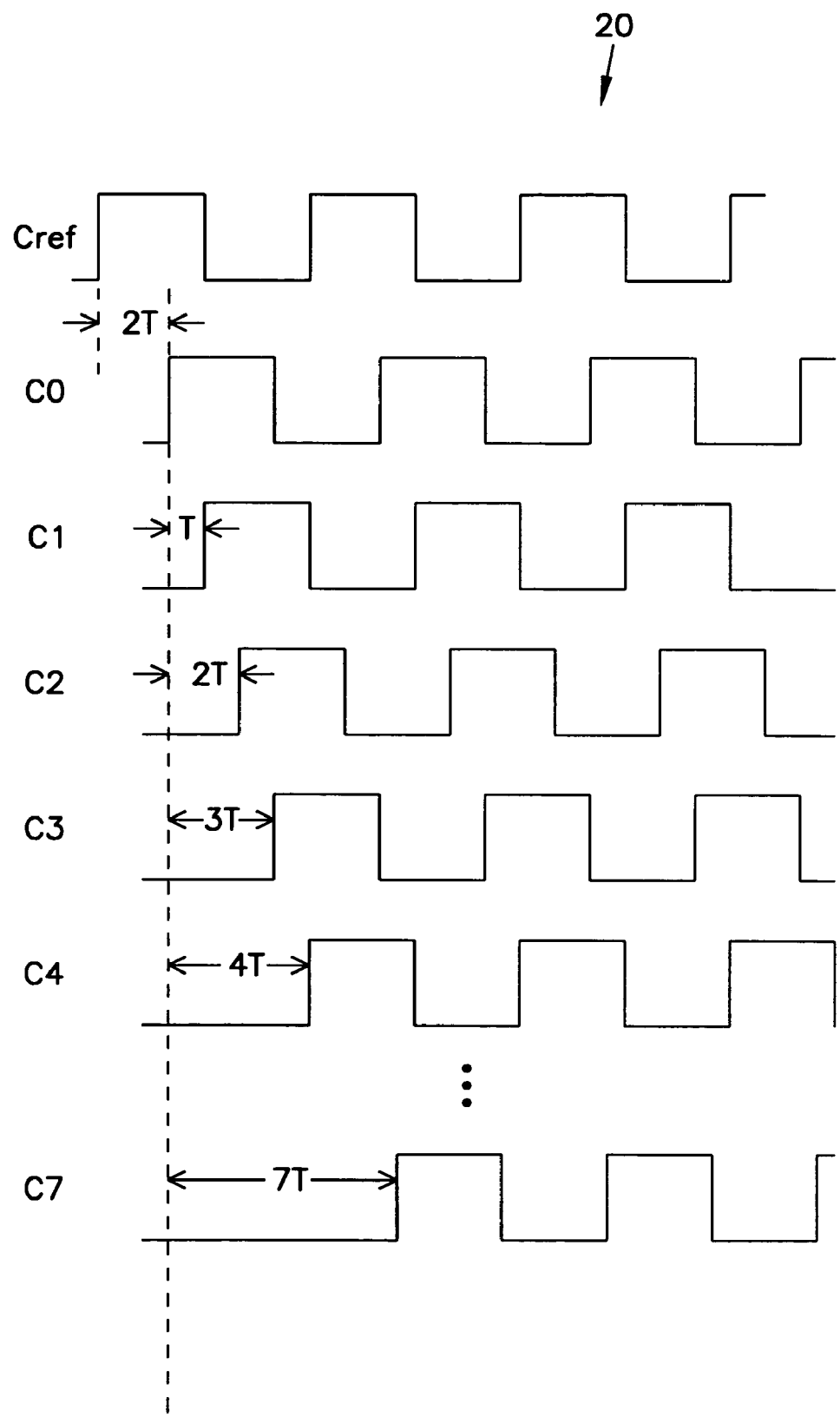
FIG. 2 is a timing diagram illustrating various outputs of clock generation circuit 10.

Differential-phase amplifier 155, on the other hand, detects phase, or synchronization, errors between one of the even clock signals and one of the clock signals of delay loop 14 and adjusts the delays of one or more of the elements of loop 14. In the exemplary embodiment, differential-phase amplifier 155 measures the phase error between even clock signal C28 and the output of delay element 154, which, like signal C28, is delayed 28 delay periods relative signal C0. Based on this phase error, amplifier 155 controls the delay of elements 141 and 154, thereby keeping their respective output clock signals C1 and C28' in phase with even clock signal C28. Consequently, output signals C1 and C28' are also kept in phase with all the other clock signals. FIG. 2 shows an exemplary timing diagram 20 illustrating the phase or timing relationship of clock signals Cref, C0–C7.

Figure 3:
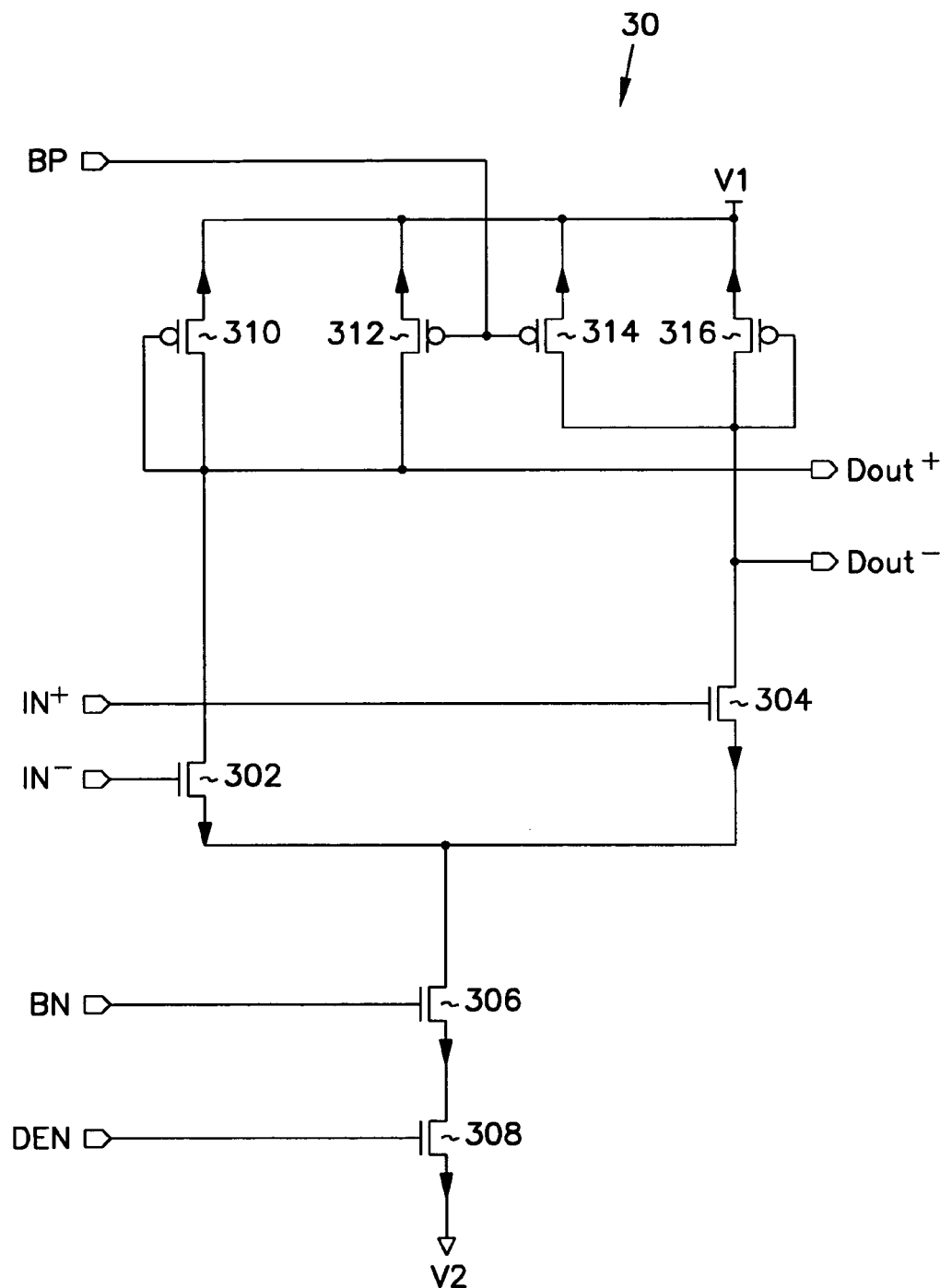
FIG. 3 is a schematic diagram of an exemplary delay element 30 for use in exemplary clock generation circuit 10.

FIG. 3 shows an exemplary embodiment of a differential delay element 30 which can be used in the present invention. Delay element 30 includes inputs IN+, IN−, BP, BN, and DEN, outputs DOUT+ and DOUT−, power-supply nodes V1 and V2, and field-effect transistors 302–316. Transistors 302–316 have respective gates 302–316, drains 302–316, and sources 302–316. In operation, delay element 20 provides differential output signals at outputs DOUT+ and DOUT− which are delayed relative differential input signals at inputs IN+ and IN−. Voltages at inputs BP and BN control the amount of delay, and input DEN is an enables input.

More specifically, FIG. 3 shows that inputs IN+ and IN− are connected respectively to the gates of transistors 302 and 304, which have their sources connected together and to the drain of transistor 306. Source 306 is connected to supply node V2 via transistor 308. Gate 306 is connected to input BN, and gate 308 is connected to input DEN which enables the delay element. Inputs BP and BN provide bias voltages which regulate the delay of element 30. In the exemplary embodiment, input BP ranges from 1.1 volts to 1.6 volts; input BN ranges from 0.8 volt to 2.5 volts; and supply nodes V1 and V2 provide 2.5 and 0.0 volts, respectively. Control voltages on inputs BN and BP set the delay of element 30 as 2T (156 picoseconds) or as 3T (234 picoseconds), for example.

Drain 302 is connected to supply node V1 through transistors 310 and 312, and drain 304 is connected to supply node V1 through transistors 314 and 316. Gate 310 is connected to drain 310, to drain 312, and to output DOUT+. Gates 312 and 314 are connected together and to input BP. Gate 316 is connected to drain 316, to drain 314, and to output DOUT−. (For further details, refer to Maneatis, Low-Jitter Process-Independent DLL and PLL Based on Self-Biased Techniques, November 1996, IEEE Journal of Solid-State Circuits, Vol. 31, pp. 1723–32, which is incorporated herein by reference.)

Figure 4:
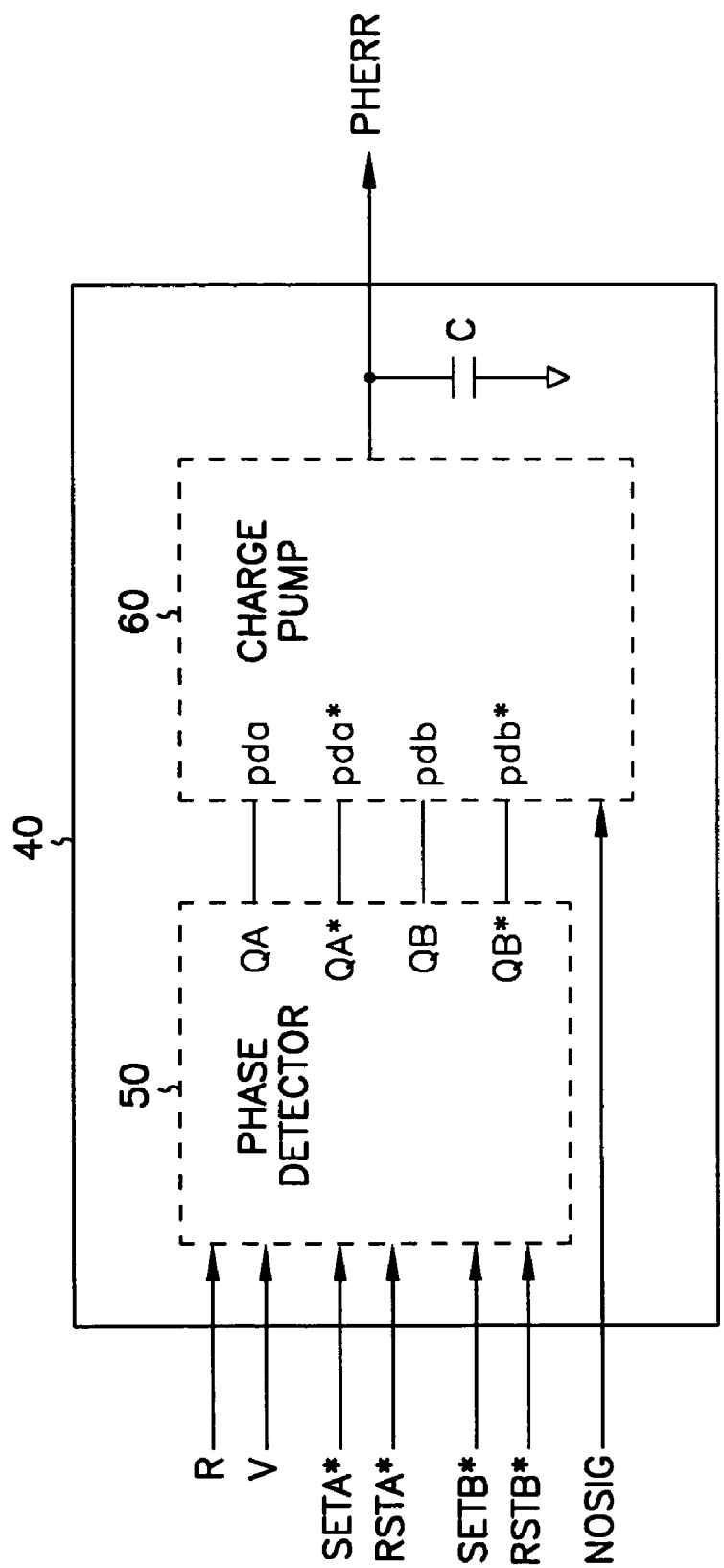
FIG. 4 is a block diagram of an exemplary differential phase amplifier 40, including a phase detector 50 and a charge pump 60, for use in exemplary clock generation circuit 10.

FIG. 4 shows a block diagram of an exemplary differential-phase amplifier 40 which can be used as a model for amplifiers 138 and 155 in FIG. 1. In addition to a phase detector 50 and a charge pump 60, amplifier 40 includes inputs R, V, SETA*, RSTA*, SETB*, RSTB*, and NOSIG and an output PHERR. Phase detector 50 generates and forwards signals QA, QA*, QB, QB* to charge pump inputs pda, pda*, pdb, and pdb*. In turn, charge pump 60 generates a current which is integrated by a capacitor C to produce an output signal PHERR based on the phase difference between signals at inputs R and V.

Figure 5:
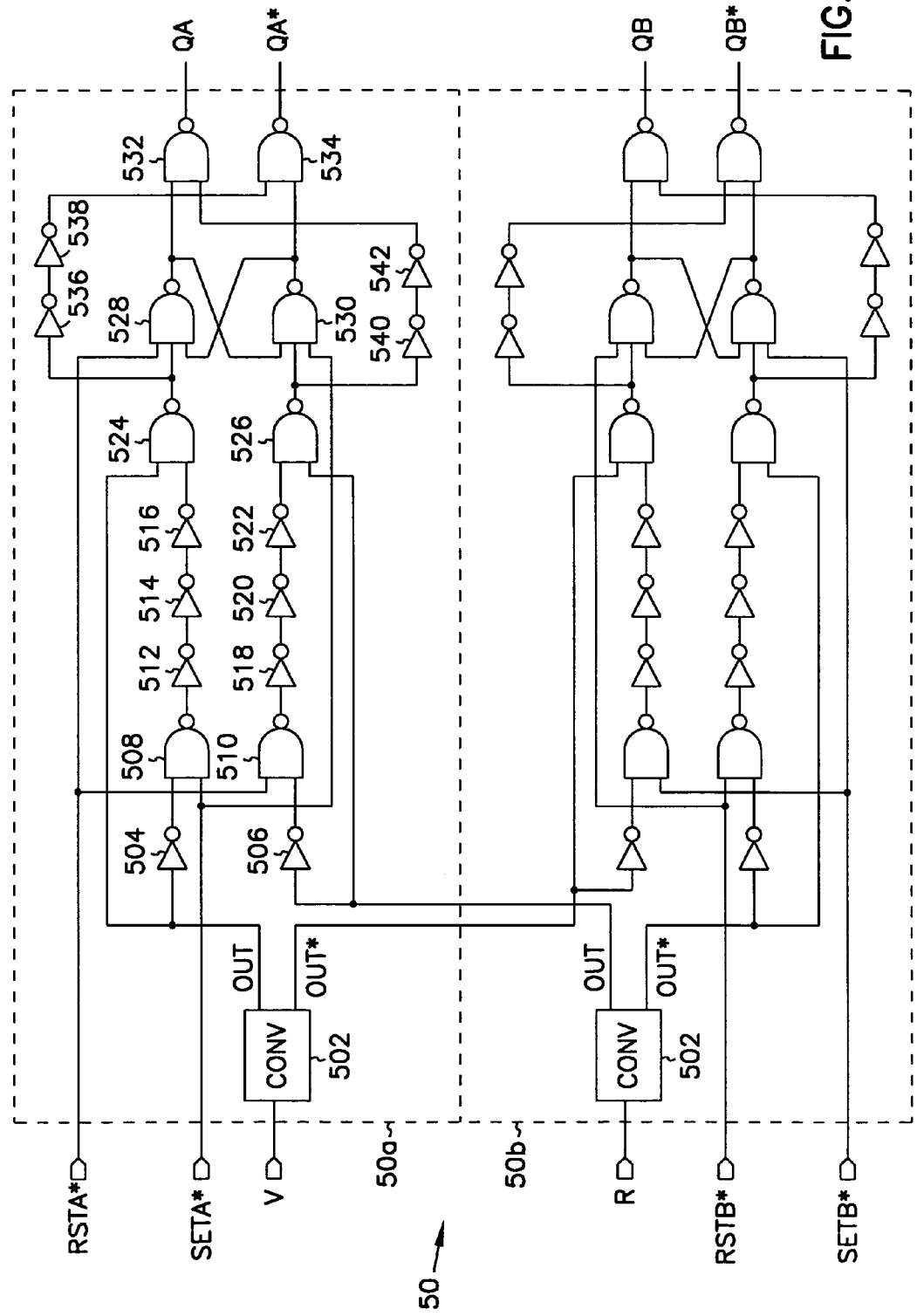
FIG. 5 is a schematic diagram of an exemplary phase detector 50.
Figure 6:
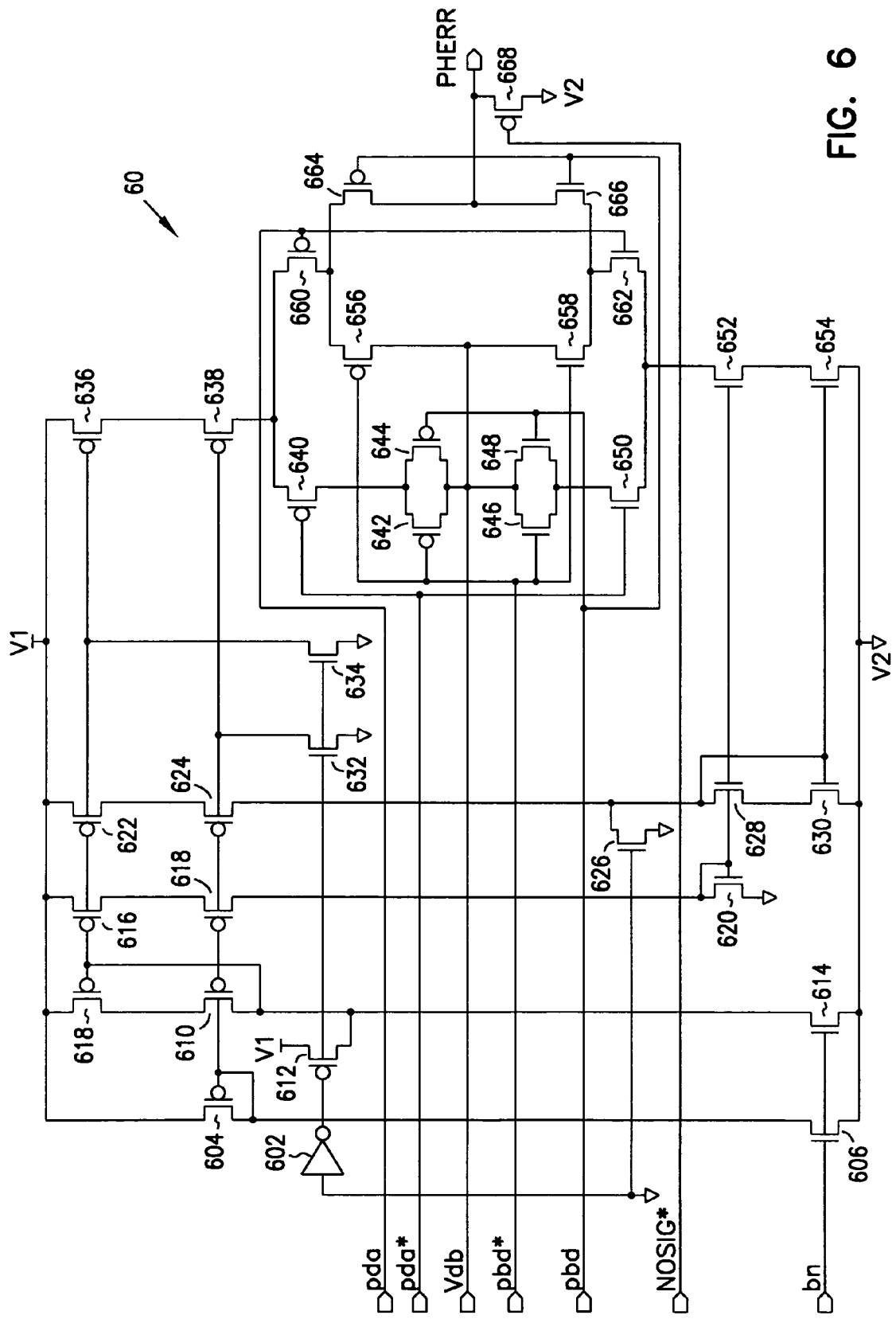
FIG. 6 is a schematic diagram of an exemplary charge pump 60.

FIGS. 5 and 6 show details of exemplary embodiments of phase detector 50 and charge pump 60. These embodiments are described in co-pending and co-assigned U.S. patent application Ser. No. 09/260,212 which is entitled Method and Apparatus for Generating Phase Dependent Control Signal and incorporated herein by reference.

In particular, FIG. 5 shows that phase detector 50, which detects the phase difference between inputs R and V, is a logic circuit having upper and lower halves 50a and 50b. Upper half 50a includes inputs V, RSTA*, and SETA* (which receive similarly named signals); a single-to-differential converter 502; inverters 504 and 506; NAND gates 508 and 510, inverters 512, 514, 516, 518, 520, and 522; NAND gates 524, 526, 528, 530, 532, and 534; and inverters 536, 538, 540, and 542. Converter 502 receives input V and NAND gates 532 and 534 provide outputs QA and QA*. Lower half 50b, which receives input R and provides outputs QB and QB*, includes a similar set of components, which for sake of brevity are not itemized or described here. In general, phase detector 50 operates according to known principles, to generate signals QA, QA*, QB, and QB* indicative of the phase relationship between signals at inputs R and V.

FIG. 6 shows details of an exemplary embodiment of charge pump 60, which includes inputs pda, pda*, pdb, pdb*, bn, and NOSIG*; output PHERR; voltage supply nodes V1 and V2; an inverter 602; and field-effect transistors 604, 606, 608, . . . , 668. Transistors 604–668 include respective gates 604–668, drains 604–668, and sources 604–668, which for sake of clarity have not been numbered in the figure. Charge pump 60 operates to convert the phase signals provided by phase detector 50 at inputs pda, pda*, pdb, and pdb* into output signal PHERR which represents the phase relationships of inputs signals, for example, clock signals C0 and C16 or clock signals C28 and C28' in FIG. 1, connected to inputs R and V of phase detector 50 in FIGS. 4 and 5.

Figure 7:
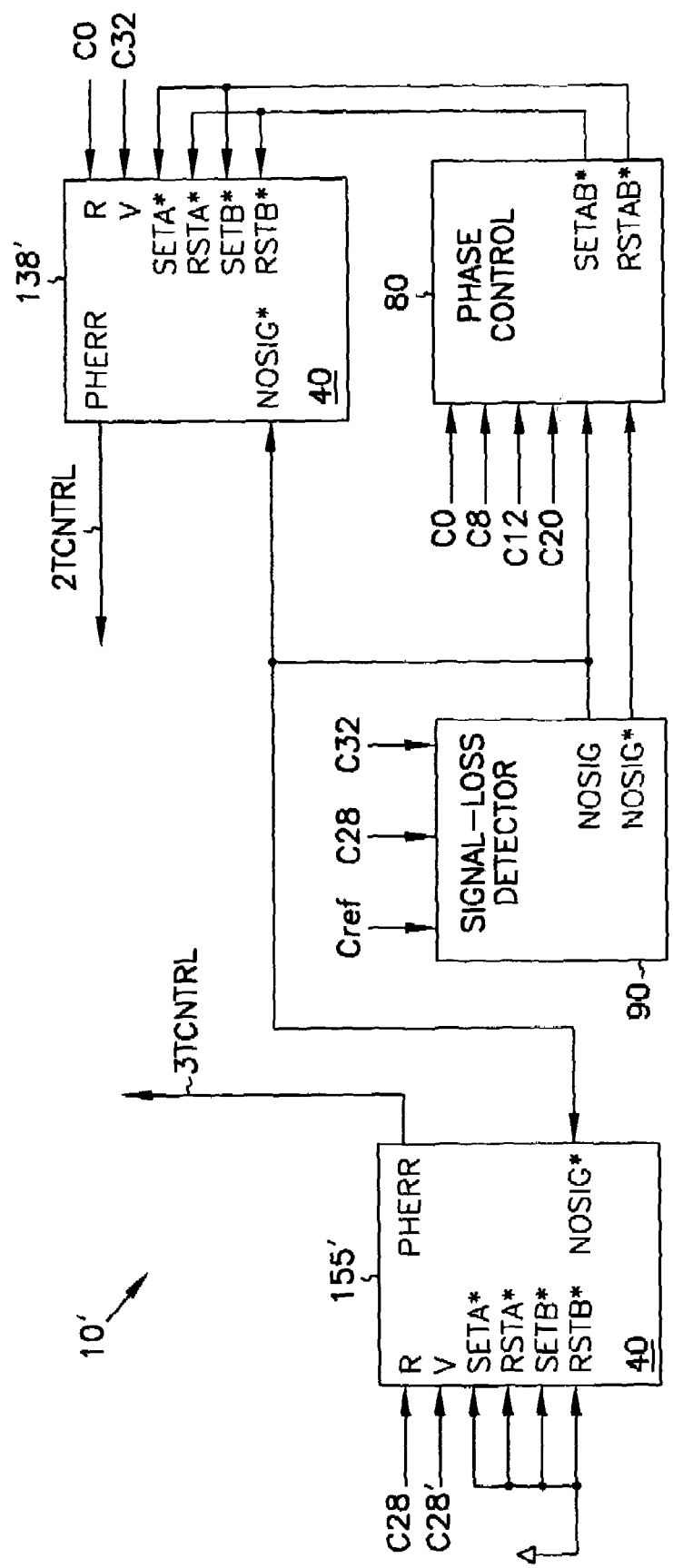
FIG. 7 is a block diagram illustrating use of the exemplary differential phase amplifier in FIG. 4 in clock generation circuit 10.

FIG. 7 shows more specifically how one embodiment of the invention develops control signals 2TCNTRL and 3TCNTRL using differential-phase amplifiers having the circuit configuration of exemplary differential-phase amplifier 40. In particular, FIG. 7 shows differential-phase amplifiers 138' and 155' as circuit blocks with inputs and outputs as presented for amplifier 40 in FIG. 4. FIG. 7 also shows two additional circuits blocks, a phase control 80 and a signal-loss detector 90.

Figure 8:
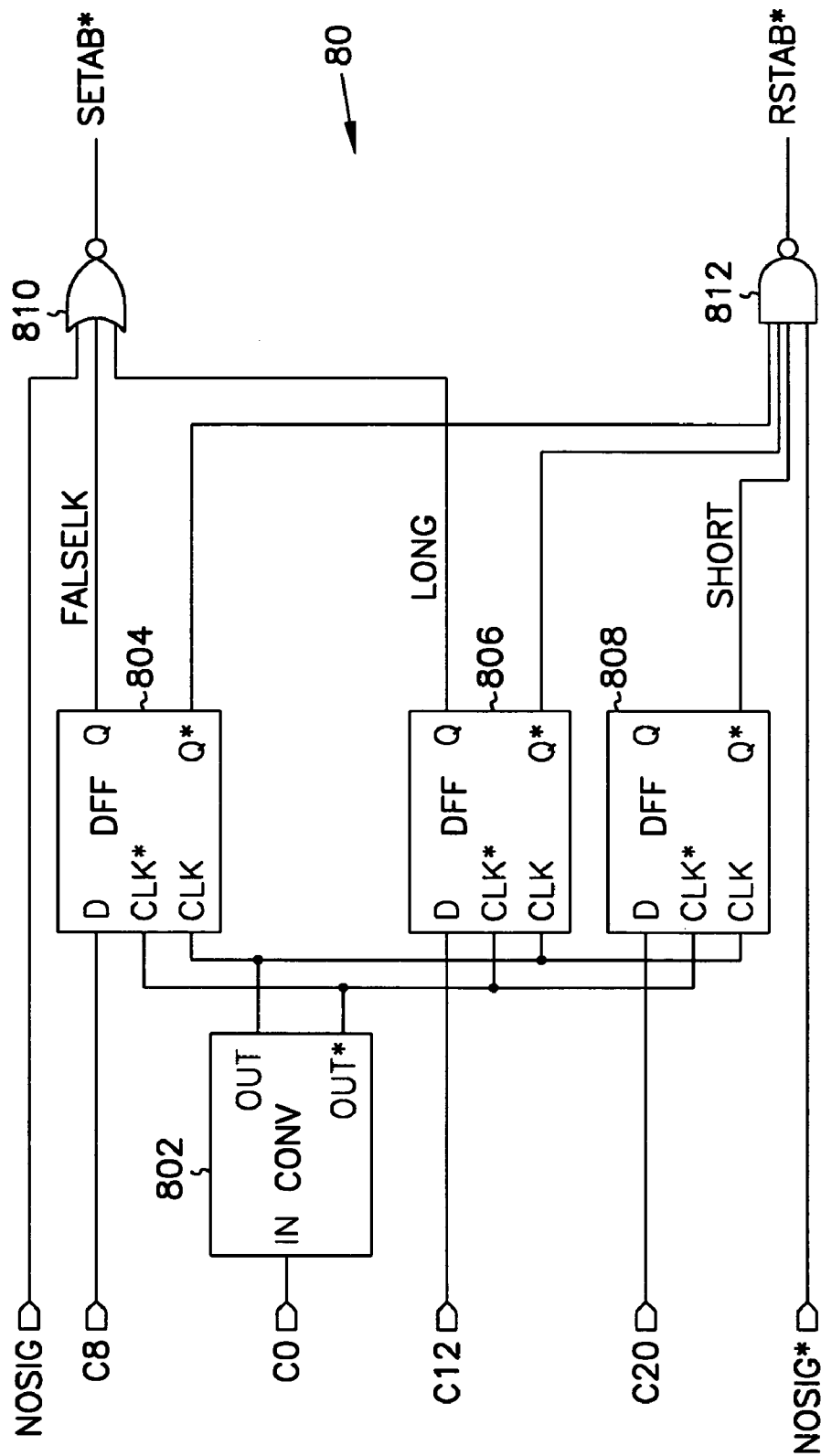
FIG. 8 is a schematic diagram of a phase control block 80 referenced in FIG. 7.

Phase control 80, which prevents amplifier 138' from false-locking, has inputs for one or more of the even clock signals, for example, C0, C8, C12, and C20 and generates two outputs signals SETAB* and RSTAB*. Output signal SETAB* drives the RSTA* and RSTB* inputs of differential amplifier 138', and output signal RSTAB* drives the SETA* and SETB* inputs of amplifier 138'. (Amplifier 155' is unlikely to exhibit false-lock since signals C28 and C28' are generally never more than 700 picoseconds apart.) FIG. 8 shows details of an exemplary embodiment of phase control 80, which includes a single-to-differential signal converter 802, delay (or D-type) flip-flops 804, 806, and 808, a three-input NOR gate 810, and a four-input NAND gate 812. Each flip-flop includes respective inputs D, CLK, and CLK*, and respective outputs Q and Q*.

More particularly, input NOSIG drives one input of NOR gate 810. Clock signal C0 feeds single-to-differential signal converter 802, which provides respective positive and negative differential signals to the respective CLK* and CLK inputs of flip-flops 804, 806, and 808. Clock signal C8 drives input D of flip-flop 804; clock signal C12 drives input D of flip-flop 806; and clock signal C20 drives input D of flip-flop 808. Input NOSIG* drives one input of NAND gate 812.

Outputs Q and Q* of flip-flop 804 are connected respectively to one input of NOR gate 810 and to one input of NAND gate 812. Outputs Q and Q* of flip-flop 806 are connected respectively to one input of NOR gate 810 and to one input of NAND gate 812. And outputs Q* of flip-flop 808 is connected to one input of NAND gate 812. The Q outputs of flip-flops 804 and 806 are respectively labeled FALSELK and LONG, and the Q* output of flip-flop 808 is labeled SHORT.

In operation, phase control 80 prevents differential phase amplifier 138' from locking when delay-locked loop 12 includes more than one cycle of reference clock signal Cref. In other words, it prevents amplifier 138' from false-locking. More specifically, during normal or true lock conditions, using clock signal C0 to "clock" signals C8, C12, and C20 into respective flip-flops 804, 806, and 808 makes signal FALSELK low, signal LONG low, and signal SHORT low. Assuming NOSIG is low, this condition forces both SETAB* and RSTAB* high. As a consequence, amplifier 138' operates normally, with input signals at inputs R and V, namely clock signal C0 and C32, determining its output.

During a false-lock condition, FALSELK is high, LONG is high, and SHORT is low. Under this condition, SETAB* is low and RSTAB* is high. A high SETAB* signal overrides the input signals at inputs R and V of amplifier 138', and causes the charge pump output to slew negative until the false-lock condition is cleared.

Phase control 80 also hastens the occurrence of lock when the delay line is running a little long or short, that is, too slow or too fast. During true-lock conditions, clock signals C12 and C20 define an "approximately locked" window. If the rising edge of clock signal C0 clocks a low state of signal C12 and a high state of signal C20 (and a low state of signal C8), the loop is near lock, and the charge pump operates normally, that is, in proportion to the phase error. If the rising edge of clock C0 signal C0 clocks a high state of signal C12 (and signal C8 is in a low state), the delay line is running long, this condition forces SETAB* to a low state, which in turn, hastens lock by slewing the charge pump output negative. Conversely, if clock signal C8 is low and C20 is low, the delay line is a little short. This forces RSTAB* low, which in turn slews the charge pump output positive. In other words, during these long and short conditions, the charge pump output is no longer proportional to the phase difference as it is during near-lock conditions, but is pushed hard in one direction or the other until a near-lock condition exists.

Figure 9:
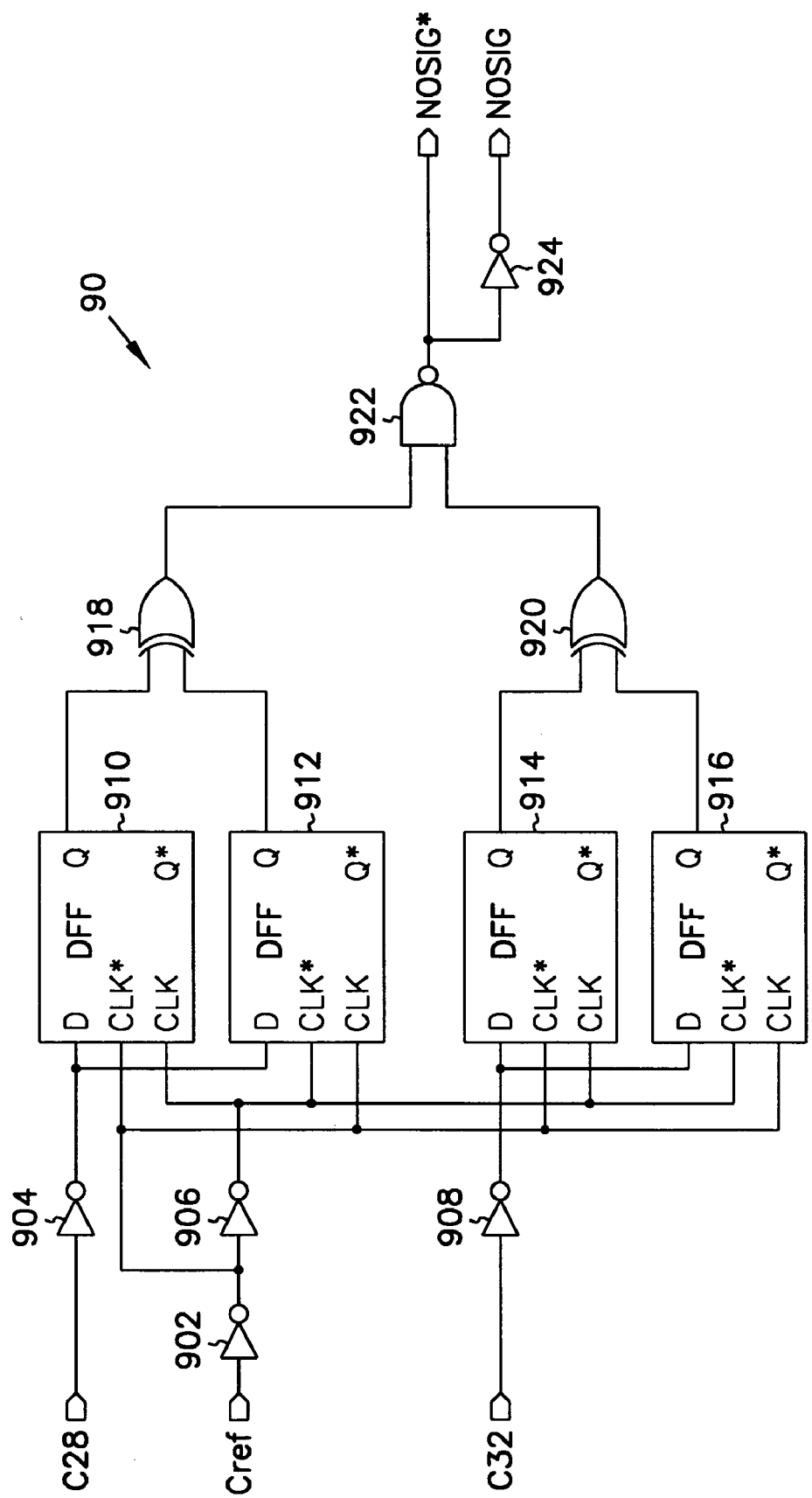
FIG. 9 is a schematic diagram of a signal-loss detector 90 referenced in FIG. 7.

FIG. 9 shows an exemplary embodiment of signal-loss detector 90, which monitors or samples clock signals Cref, C28, and C32 to facilitate the recovery of circuit 10' from start-up conditions, power-supply transients, temporary clock interruptions, and so forth which can sometimes lead to loss of a signal from one or more delay elements in a delay-locked loop. During these signal losses, a phase detector, such as phase detector 50, may "hang" in a state that ultimately causes a voltage-controlled delay element, such as element 30 in FIG. 3, to cease signal transmission. Signal-loss detector 90 senses the loss of a signal and provides a signal NOSIG* which is used to override the "normal" up and down signals produced by phase detector 50 and to drive charge pump 60 to change its output signal.

The exemplary embodiment of detector 90 has previously been described in co-pending and co-assigned patent application Ser. No. 09/316,076 which is entitled Synchronous Clock Generator Including A Delay-Locked Loop Signal Loss Detector and incorporated herein by reference. Detector 90 includes three clock signal inputs C8, Cref, and C16; inverters 902, 904, 906, and 908; D-type flip-flops 910, 912, 914, and 916; two-input XOR gates 918 and 920; two-input NAND gate 922; and inverter 924. Each flip-flop includes respective inputs D, CLK, and CLK*, and respective outputs Q and Q*.

Clock signal input C28 is connected via inverter 904 to input D of flip-flops 910 and 912. Clock signal input C32 is similarly connected via inverter 908 to input D of flip-flops 914 and 916. Clock signal input Cref drives the input of inverter 902, which in turn drives the input of inverter 906. The output of inverter 902 is connected to the CLK* input of flip-flops 910, 912, 914, and 916. The output of inverter 906 is connected to the CLK input of flip-flops 910, 912, 914, and 916.

Outputs Q and Q* of flip-flops 910 and 912 are connected to the inputs of XOR gate 918, which has its output connected to an input of NAND gate 922. Similarly, outputs Q and Q* of flip-flops 914 and 916 are connected to the inputs of NOR gate 920, which has its output connected to another input of NAND gate 922. NAND gate 922 provides signal NOSIG*, and inverter 924, which is connected to the output of NAND gate 922, provides signal NOSIG.

Exemplary Embodiments of Computer Systems Incorporating the Invention

Figure 10:
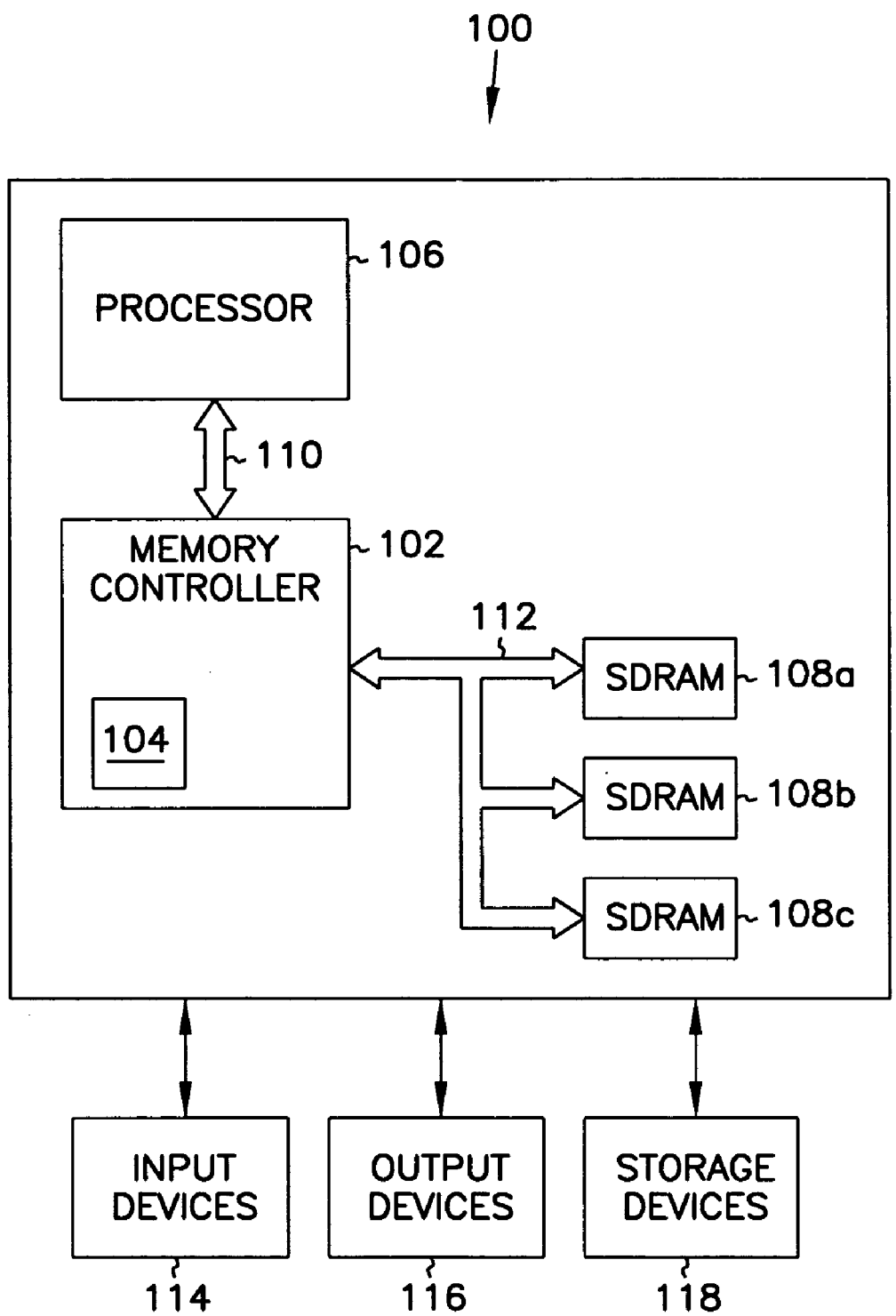
FIG. 10 is a block diagram of a computer system 100 with a memory controller that incorporates a clock-generation circuit in accord with the invention.

FIG. 10 shows an exemplary computer system 100 which includes a memory controller 102 which incorporates one or more clock generation circuits 104 that embody the concepts of the present invention. In addition to memory controller 102 and clock generation circuit 104, system 100 includes a processor 106 and synchronous dynamic random access memories (SDRAMs) 108a, 108b, and 108c, which are coupled via respective buses 110 and 112 to memory controller 102. As known in the art, processor 106 performs a variety of functions using instructions and data stored in SDRAMs 108a–108c, with memory controller 102 and clock generation circuit 104 facilitating, for example, read and write operations. In the exemplary embodiment, processor 106 is an Intel Pentium II processor; however, other embodiments use distributed processors, parallel processors, or digital signal processors.

System 100 also includes input devices 114, output devices 116, and data-storage devices 118. Exemplary input devices include a keyboard, mouse, joystick, microphone, video camera, etc. Exemplary output devices include a color monitor, printer, and virtual-reality goggles. Exemplary data-storage devices include hard disk drives, optical disk drives, or floppy disk drives.

Figure 11:
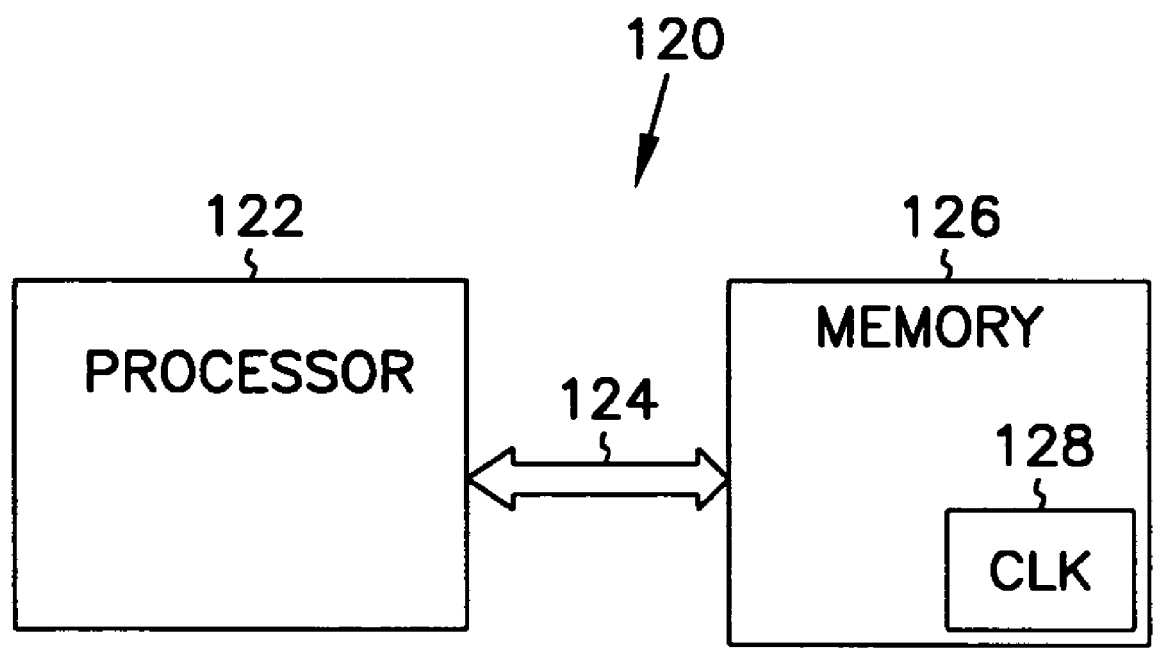
FIG. 11 is a block diagram of a computer system 120 with a memory circuit 126 that incorporates a clock-generation circuit 128 in accord with the invention.

FIG. 11 shows another computer system 120 incorporating the invention. Computer system 120 includes a processor 122 coupled to a integrated memory circuit 126 via bus 124. Memory circuit 126 includes a clock-generation circuit 128 in accord with the teachings of the present invention.

CONCLUSION

In furtherance of the art, the inventor has presented a clock generation circuit which includes a number of delay elements and which provides at least one clock signal delayed relative a reference clock signal by a delay period less than that of the delay elements. In an exemplary embodiment, the circuit includes two interlaced delay-locked loops, a first having two or more delay elements with a first nominal delay and a second having at least one delay element with a second nominal delay. In operation, the two loops are synchronized, or phase locked to each other, and provide a at least one clock signal delayed relative a reference clock signal by the difference between the first and second nominal delay. The invention thus teaches not only a family of circuits but also an associated methodology which overcome the limits of conventional delay elements without the use and disadvantages of interpolation circuitry.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

The invention claimed is:

1. A clock-generation circuit comprising:
   a first delay element configured to provide a first nominal delay and having a first input and a first output, with the first input configured to receive a reference clock signal;
   a second delay element configured to provide a second nominal delay different from the first nominal delay by about 50 percent and having a second input and a second output, with the second input configured to receive the reference clock signal; and a differential phase amplifier having first and second inputs connected respectively to the first and second outputs of the delay elements and having an output connected to control only one of the first and second delay elements.

2. The circuit of claim 1;

wherein the second delay element includes a control node; and wherein the differential phase amplifier includes first and second inputs for receiving respective first and second signals and an output for outputting a signal based on a phase relationship of the first and second signals, with the first input of the differential phase amplifier coupled to the output of the first delay element and the output of the differential phase amplifier coupled to the control node of the second delay element.

3. The circuit of claim 2 wherein the first and second delay elements have substantially identical circuit topologies.

4. The circuit of claim 2 wherein the second nominal delay is within 100 picoseconds of the first nominal delay.

5. The circuit of claim 2 wherein the first and second delay elements each comprise means for delaying a signal in response to a control voltage.

6. A clock-generation circuit comprising:

a first continuously adjustable delay element configured to provide a first nominal delay relative to a reference clock signal;

a second continuously adjustable delay element configured to provide a second nominal delay, relative to the reference clock signal, that is different from the first nominal delay by about 50 percent; and a differential phase amplifier having a first input connected to an output of the first delay element, a second input connected to an output of the second delay element, and an output connected to a control node of only one of the first and second delay elements.

7. The circuit of claim 6 wherein the second nominal delay is within 100 picoseconds of the first nominal delay.

8. The circuit of claim 6 wherein the first and second delay elements each comprise means for delaying a signal in response to a control voltage.

9. A clock-generation circuit comprising:

one or more first delay elements which provide a first nominal delay of a reference clock signal;

one or more second delay elements which provide a second nominal delay of the reference clock signal different from the first nominal delay by at least 50 percent; and a differential phase amplifier having first and second inputs coupled respectively to at least one of the first delay elements and to one of the second delay elements and an output coupled to control only one of the first and second nominal delays, wherein the differential phase amplifier comprises a phase detector and a charge pump.

10. The circuit of claim 9 wherein the second nominal delay is within 100 picoseconds of the first nominal delay.

11. The circuit of claim 9 wherein the first and second delay elements each comprise means for delaying a signal in response to a control voltage.

12. A circuit comprising:

one or more first delay elements which provide a first nominal delay;

one or more second delay elements which provide a second nominal delay different from the first nominal delay by at least 50 percent;

a first differential phase amplifier responsive to at least one of the first delay elements and to one of the second delay elements to control only one or more of the second delay elements, wherein the differential phase amplifier comprises a phase detector and a charge pump; and a second differential phase amplifier responsive to at least one of the first delay elements and to one of the second delay elements to control only one or more of the second delay elements.

13. The circuit of claim 12 wherein the second nominal delay is within 100 picoseconds of the first nominal delay.

14. The circuit of claim 12 wherein the first and second delay elements each comprise means for delaying a signal in response to a control voltage.

15. A circuit comprising:

one or more first delay elements which provide a first nominal delay, with at least one of the first delay elements having an input configured to receive a reference clock signal;

one or more second delay elements which provide a second nominal delay different from the first nominal delay, with at least one of the second delay elements having an input configured to receive the reference clock signal; and a differential phase amplifier responsive to at least one of the first delay elements and to one of the second delay elements to control only one of the second delay elements:

wherein each delay element comprises one or more field-effect transistors; and wherein the first and second nominal delays differ by about 50 percent.

16. The circuit of claim 15 wherein the second nominal delay is within 100 picoseconds of the first nominal delay.

17. The circuit of claim 15 wherein the first and second delay elements each comprise means for delaying a signal in response to a control voltage.

18. A memory controller comprising:

a first delay element configured to provide a first nominal delay relative to a reference clock signal;

a second delay element configured to provide a second nominal delay different from the first nominal delay relative to the reference clock signal; and a differential phase amplifier having a first input connected to an output of the first delay element, a second input connected to an output of the second delay element, and an output connected to a control node of only one of the first and second delay elements, wherein the first nominal delay differs from the second nominal delay by about 50 percent.

19. The controller of claim 18 wherein the first and second delay elements each comprise means for delaying a signal in response to a control voltage, and the first nominal delay is within 100 picoseconds of the second nominal delay.

20. A memory controller comprising:

a first delay element configured to provide a first nominal delay and to receive a reference clock signal;

a second delay element configured to provide a second nominal delay different from the first nominal delay and to receive the reference clock signal; and a differential phase amplifier having a first input connected to an output of the first delay element, a second input connected to an output of the second delay element, and an output connected to a control node of only one of the first and second delay elements, wherein each delay element comprises one or more field-effect transistors and the first and second nominal delays differ by about 50 percent.

21. The controller of claim 20 wherein the first and second delay elements each comprise means for delaying a signal in response to a control voltage, and the first nominal delay is within 100 picoseconds of the second nominal delay.

22. A memory controller comprising:
a first delay element configured to provide a first nominal delay relative to a reference clock signal;
a second delay element configured to provide a second nominal delay, relative to the reference clock signal, different from the first nominal delay by at least 50 percent; and
a differential phase amplifier having a first input connected to an output of the first delay element, a second input connected to an output of the second delay element, and an output connected to a control node of only one of the first and second delay elements, wherein the differential phase amplifier comprises a phase detector and a charge pump.

23. The controller of claim 22 wherein the first and second delay elements each comprise means for delaying a signal in response to a control voltage, and the differential phase amplifier comprises means for amplifying a difference between first and second input signals.

24. A system comprising:
a processor;
one or more integrated-circuit memories;
one or more input, output, or storage devices; and
a memory controller coupled to the processor and to the one or more integrated-circuit memories, the memory controller comprising:
a first delay element configured to provide a first nominal delay and to receive a reference clock signal;
a second delay element configured to provide a second nominal delay different from the first nominal delay by at least 50 percent and to receive the reference clock signal; and
a differential phase amplifier having a first input connected to an output of the first delay element, a second input connected to an output of the second delay element, and an output connected to a control node of only one of the first and the second delay elements.

25. The system of claim 24 wherein the second nominal delay is within 100 picoseconds of the first nominal delay.

26. The system of claim 24 wherein the first and second delay elements each comprise means for delaying a signal in response to a control voltage.

27. A system comprising:
a processor; and
a memory circuit coupled to the processor and comprising:
a first delay element configured to provide a first nominal delay and to receive a reference clock signal;
a second delay element configured to provide a second nominal delay different from the first nominal delay by about 50 percent and to receive the reference clock signal; and
a differential phase amplifier having a first input connected to an output of the first delay element, a second input connected to an output of the second delay element, and an output connected to a control node of only one of the first and the second delay elements.

28. The system of claim 27 wherein the second nominal delay is within 100 picoseconds of the first nominal delay.

29. The system of claim 27 wherein the first and second delay elements each comprise means for delaying a signal in response to a control voltage, and the differential phase amplifier comprises means for amplifying a difference between first and second input signals.

30. An apparatus for generating clock signals, comprising:
circuitry for generating a first set of two or more even clock signals, each delayed relative to a reference clock signal by an even multiple of a first delay period;
circuitry for generating a second set of one or more odd clock signals, of which one or more are delayed relative to the reference clock signal by an odd multiple of the first delay period and at least one is delayed by an even multiple of the first delay period; and
circuitry for synchronizing the second set of clock signals to one or more of the first set of clock signals.

31. The apparatus of claim 30, wherein the circuitry for generating the first set of two or more even clock signals comprises means for generating a first set of two or more even clock signals, each delayed relative the reference clock signal by an even multiple of the first delay period.

32. The apparatus of claim 30, wherein the circuitry for generating the second set of one or more odd clock signals, comprises means for generating the second set of one or more odd clock signals, of which one or more are delayed relative the reference clock signal by an odd multiple of the first delay period and at least one is delayed by an even multiple of the first delay period.

33. The apparatus of claim 30, wherein the circuitry for synchronizing the second set of clock signals to one or more of the first set of clock signals, comprises means for synchronizing the second set of clock signals to one or more of the first set of clock signals.

34. An apparatus for generating clock signals, comprising:
circuitry for synchronizing a first set of two or more even clock signals to a reference clock signal, with each even clock signal delayed relative to the reference clock signal by an even multiple of a delay period; and
circuitry for synchronizing a second set of one or more odd clock signals to one or more of the even clock signals, with each odd clock signal delayed relative to the reference clock signal by an odd multiple of the delay period.

35. The apparatus of claim 34, wherein:
circuitry for synchronizing the first set of two or more even clock signals to the reference clock signal, comprises means for synchronizing the first set of two or more even clock signals to the reference clock signal, with each even clock signal delayed relative the reference clock signal by an even multiple of the delay period; and
circuitry for synchronizing the second set of one or more odd clock signals to one or more of the even clock signals, comprises means for synchronizing the second set of one or more odd clock signals to one or more of the even clock signals, with each odd clock signal delayed relative the reference clock signal by an odd multiple of the delay period.

36. The apparatus of claim 35 wherein the delay period is less than 100 picoseconds.

37. An apparatus for generating one or more clock signals delayed relative a reference clock signal by an integral multiple of a desired nominal delay period, the apparatus comprising:
  circuitry for providing a first delay-locked loop comprising a chain of two or more delay elements, each providing a first nominal delay and a respective clock signal relative to the reference clock signal;
  circuitry for providing a second delay-locked loop comprising one or more delay elements, each providing a respective clock signal relative to the reference clock signal and at least one providing a second nominal delay different from the first nominal delay by an amount substantially equal to the desired nominal delay period; and
  circuitry for synchronizing one or more delay elements of the second delay loop to a clock signal of the first delay-locked loop, thereby causing one or more clock signals of the second delay-locked loop to be delayed relative to one or more of the output signals of the first delay-locked loop by the desired nominal delay period.

38. The apparatus of claim 37 wherein the desired nominal delay period is less than 100 picoseconds.

39. The apparatus of claim 37 wherein the first and second delay elements have substantially identical circuit topologies.

* * * * *